United States Patent
Ndip et al.

(10) Patent No.: US 11,283,166 B2
(45) Date of Patent: Mar. 22, 2022

(54) MODULE UNIT HAVING INTEGRATED ANTENNAS

(71) Applicant: Fraunhofer-Gesellschaft zur Foerderung der angewandten Forschung e.V., Munich (DE)

(72) Inventors: Ivan Ndip, Berlin (DE); Kai Zoschke, Berlin (DE); Klaus-Dieter Lang, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/275,243

(22) Filed: Feb. 13, 2019

(65) Prior Publication Data

US 2019/0252772 A1 Aug. 15, 2019

(30) Foreign Application Priority Data

Feb. 15, 2018 (DE) .............. 10 2018 202 364.6

(51) Int. Cl.
| | |
|---|---|
| *H01Q 1/52* | (2006.01) |
| *H01Q 1/48* | (2006.01) |
| *H01Q 1/38* | (2006.01) |
| *H01Q 21/00* | (2006.01) |
| *H01Q 1/02* | (2006.01) |

(52) U.S. Cl.
CPC .............. *H01Q 1/526* (2013.01); *H01Q 1/02* (2013.01); *H01Q 1/38* (2013.01); *H01Q 1/48* (2013.01); *H01Q 1/523* (2013.01); *H01Q 21/0025* (2013.01); *H01Q 21/0087* (2013.01)

(58) Field of Classification Search
CPC ............ H01Q 1/38; H01Q 1/48; H01Q 1/523; H01Q 1/526; H01Q 1/2283; H01Q 21/0025; H01Q 21/0087; H01Q 21/065
USPC .................... 343/700 MS, 850, 873, 893
See application file for complete search history.

(56) References Cited

U.S. PATENT DOCUMENTS

| | | | |
|---|---|---|---|
| 7,728,774 B2 | 6/2010 | Akkermans et al. | |
| 8,134,224 B2 * | 3/2012 | Sagae | H01L 29/16 257/655 |
| 9,246,214 B2 * | 1/2016 | Pope | H01Q 1/526 |
| 2010/0001906 A1 * | 1/2010 | Akkermans | H01L 23/66 343/700 MS |
| 2011/0279190 A1 | 11/2011 | Liu et al. | |
| 2012/0212384 A1 * | 8/2012 | Kam | G06K 19/07775 343/767 |

(Continued)

FOREIGN PATENT DOCUMENTS

DE 102007046471 A1 5/2008

*Primary Examiner* — Tung X Le
(74) *Attorney, Agent, or Firm* — Perkins Coie LLP; Michael A. Glenn

(57) ABSTRACT

A module unit includes a carrier substrate and an antenna substrate. The carrier substrate at least includes an embedded chip and a redistribution layer arranged on the first main surface. The antenna substrate including a base material includes an antenna structure arranged on the side of the first main surface, and a cavity introduced on the side of the second main surface, the cavity being aligned with the antenna structure at least in areas. The antenna substrate is connected with the second main surface to the first main surface of the carrier substrate, so that the antenna substrate and the carrier substrate form a layer stack.

17 Claims, 15 Drawing Sheets

(56) References Cited

U.S. PATENT DOCUMENTS

| | | | |
|---|---|---|---|
| 2015/0129668 A1 | 5/2015 | Kam et al. | |
| 2016/0049723 A1* | 2/2016 | Baks | H01Q 1/2291 343/848 |
| 2017/0346185 A1* | 11/2017 | Wang | H01Q 1/2283 |
| 2019/0013203 A1* | 1/2019 | Sreenivasan | H01L 29/78618 |

\* cited by examiner

MODULE UNIT HAVING INTEGRATED ANTENNAS

CROSS-REFERENCE TO RELATED APPLICATION

This application claims priority from German Patent Application No. DE 10 2018 202 364.6, which was filed on Feb. 15, 2018, and is incorporated herein in its entirety by reference.

BACKGROUND OF THE INVENTION

Embodiments of the present invention relate to a module unit and to a method for manufacturing the same. Embodiments relate to a module unit having one or several integrated antennas. Further embodiments relate to a cavity-based system integration platform having integrated antennas.

The integration of antennas and an associated chip, such as a HF chip, into a module unit is becoming more and more important as the complexity of assembling electrical devices, such as wireless communication devices (e.g. smartphones) or radar sensors, may be significantly reduced. The conventional technology already has numerous approaches as to how a chip and an antenna may be integrated on a mutual platform. For example, reference is made to FIGS. 6a-6c.

FIG. 6a shows an integration with a carrier substrate 12, a chip 14a (clip chip assembly) mounted on a main surface 12hl of the carrier substrate 12, and an antenna substrate 16c. The same includes a cavity 16k and a pitch antenna 16p arranged in the cavity. The antenna substrate 16c is arranged on the carrier 12, or in particular on the main surface 12hl of the carrier 12, in such a way that the cavity 16 and the main surface 12hl face each other.

FIG. 6b shows a further module unit. Here, a carrier substrate 12' having two cavities 12'k1 and 12'k2 is provided. A chip 14a is provided in the cavity 12'k1, wherein a reflector 12'r is arranged in the cavity 12'k2. Now, the chip is contacted via a further layer, which is denoted with the reference numeral 12'u. The antenna 16p' is provided on this layer 12'u in the area of the cavity 12'k2.

FIG. 6c shows a further arrangement. It includes several (e.g. laminated) sheets. These are denoted with the reference numerals L0-L4, wherein a metal layer M0-M4 is provided between these sheets, respectively. The sheets L3-L4 comprise a recess in which the chip 14a is arranged. The sheet L1 comprises several recesses which are configured as cavities L1k. The metal sheet M0 is provided to be adjacent to these cavities L1k. Patch antennas M0P arranged in the area of the cavities L1k are formed in this metal sheet M0.

All above-described embodiments have in common that different materials are used, e.g. for the antenna substrate 16c, the carrier substrate 12 and the chip 14a (cf. FIG. 6a). Additionally, hollow spaces are introduced for the chip 14a (cf. FIG. 6c), e.g. through the cavity 12'k1 (cf. FIG. 6b) or the recess in the sheets L3 and L4. This material mix and the discontinuous material arrangement may pose a problem for the durability since, e.g. in the case of thermal expansions, the material transitions have emerged to be the weak points. Therefore, there is a need for an improved approach.

The object of the present invention is to provide a concept for a module unit having integrated antennas, said concept offering an improved compromise in terms of degree of integration, performance, electromagnetic compatibility (EMC) and durability.

SUMMARY

According to an embodiment, a module unit may have a carrier substrate at least including an embedded chip and a redistribution layer arranged on the first main surface; an antenna substrate including a base material, wherein the antenna substrate includes an antenna structure arranged on the side of the first main surface, and a cavity introduced on the side of the second main surface, the cavity being aligned with the antenna structure at least in areas; wherein the antenna substrate is connected with its second main surface to the first main surface of the carrier substrate so that the antenna substrate, together with the carrier substrate, forms a layer stack.

Another embodiment may have method for manufacturing a module unit having a carrier substrate which at least includes an embedded chip and a redistribution layer arranged on the first main surface, and an antenna substrate which includes an antenna structure arranged on the side of the first main surface, and a cavity introduced on the side of the second main surface, the cavity being aligned with the antenna structure at least in areas, the method having the steps of: applying the antenna substrate with the side of the second main surface onto the redistribution layer of the carrier substrate, so that the antenna substrate and the carrier substrate form a layer stack.

Embodiments of the present invention provide a module unit having a carrier substrate and an antenna substrate. The carrier substrate includes at least one embedded chip and a redistribution layer arranged on the first main surface. The antenna substrate includes a base material such as glass or silicon. The antenna substrate includes an antenna structure arranged on the side of the first main surface, and a cavity introduced on the side of the second main surface. The same is aligned with the antenna structure at least in areas. The antenna substrate is connected with its second main surface (opposing the first main surface) to the first main surface of the carrier substrate, so that the antenna substrate and the carrier substrate form a layer stack. According to embodiments, the base material for the antenna substrate and the carrier substrate is the same.

Embodiments of the present invention are based on the realization that a carrier substrate having a chip formed, or embedded (i.e. integrated), in this substrate may form a highly integrated and easy-to-produce carrier element that—because it does without cavities—is also much more mature in terms of durability. A so-called antenna substrate having integrated antenna element(s) is applied to this carrier substrate, said antenna substrate being advantageously formed of the same material as the carrier substrate in order to prevent mechanical tensions between the carrier substrate and the antenna substrate. Due to the cavity in the antenna substrate, it is possible to optimize RF characteristics. For example, it would be conceivable that a reflector would be provided in the uppermost layer of the carrier substrate, i.e. on the side facing the antenna substrate, further optimizing the RF characteristics.

According to further embodiments, a polymer layer or oxide layer is provided on the first main surface of the antenna substrate, i.e. between the antenna structure and the antenna substrate. According to further embodiments, a dielectric substrate (e.g. glass substrate) is provided on the antenna structure to close the module unit. With this dielectric substrate (e.g. glass arrangement), it is possible to further reduce the base material of the antenna substrate in the area of the cavity so that, based on the variation according to which a polymer/oxide sheet is provided between the antenna structures and the antenna substrate, the cavity may reach down to the polymer or oxide layer. Alternatively, the remainder of the base material typically remaining in this area may also be perforated. At this point, it is to be noted that, according to a further embodiment, a perforation of the additionally applied glass layer may also be provided. All these means (perforation and removal of the base material in the cavity) af-fect RF characteristics and serve to optimize them. For example, it is conceivable that an electromagnetic filter is created by a perforated area.

At this point, it should be noted that, according to embodiments, a redistribution layer is provided on the first main surface of the carrier substrate in one or several metal sheets. This redistribution layer may also comprise an integrated reflector. This integrated reflector is advantageously provided in an area of the cavity or in general in the area of the one or several antenna structures (in the sense of that it is laterally arranged). For example, contacting the one or several antenna structures takes place via this redistribution layer. Here, direct electric coupling may take place, e.g. by means of a via (protruding through the antenna substrate and, e.g., supplemented by an additional via in the polymer/oxide layer) or also in an electromagnetic manner. The direct electric coupling provides a direct connection, while, with electromagnetic coupling by means of an electromagnetic field, an electromagnetic signal is in-duced in the antenna structure. For example, this electromagnetic signal path may extend through the cavity. Assuming that the redistribution plane comprises a reflector, according to embodiments, this reflector is open in an area of the feed line so that an electromagnetic signal may be directed through the opening.

According to embodiments, one or several of these shielding vias may be provided, e.g. to shield this electromagnetic path or to generally improve the transmission characteristics. For example, these may be arranged around the cavity or also around the signal via. Alternatively or additionally, it would also be conceivable that the inside, or in particular the inner walls of the cavity, are provided with a metallization taking over the shielding and/or contributing to the shielding.

According to further embodiments, the carrier substrate comprise a so-called contacting plane on the second main surface (opposing the first main surface). It may be provided with solder balls or other connection means. Additionally or alternatively, this contacting plane may also include cooling elements, e.g. in the area of the chip. Here, it is advantageous for the embedded chip to extend across the entire depth of the carrier substrate so that the "bottom side" (side of the second main surface) may be cooled directly or that contacting may take place via the same side.

Subsequently, four embodiments are described. According to a first embodiment, both the antenna substrate and the carrier substrate comprise a semiconductor such as silicon or a silicon base. A polymer/oxide sheet is provided on the antenna substrate, wherein the additional glass pane is omitted in this embodiment. Thus, the following layer stack results in the area of the antenna structure (in the corresponding order):
1. antenna structure or antenna structures
2. polymer/oxide layer
3. base material remaining below the cavity (semiconductor such a silicon)
4. air volume or air in the cavity A further embodiment which also manages without the additional glass layer (superstrate) is comparable to the embodiment described herein, wherein a glass material is used as the base material for the antenna substrate and the carrier substrate instead of the semiconductor and the silicon material in particular.

A third embodiment also assumes that only glass material is used as the base material for the antenna substrate and the carrier substrate, wherein, as an addition, a glass sheet is applied to the antenna substrate, or the antenna structures. This glass sheet is referred to as superstrate. Based on this, the following arrangement results in the area of the antenna structure:
1. superstrate glass pane
2. antenna structure or structures
3. oxide/polymer sheet
4. air volume of the cavity By using the additional glass sheet, the base material may be omitted "below" the polymer/oxide layer.

A fourth embodiment refers to a so-called hybrid approach which is comparable to the approach number 3 having the superstrate glass sheet, a semiconductor material such as silicon being used here for the antenna substrate and the carrier substrate instead of the glass material.

Further embodiments refer to a manufacturing method having the central step of arranging the antenna substrate on a carrier substrate. This manufacturing method is not very complex and, as already explained above, enables the creation of high-quality and durable components with good RF properties.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
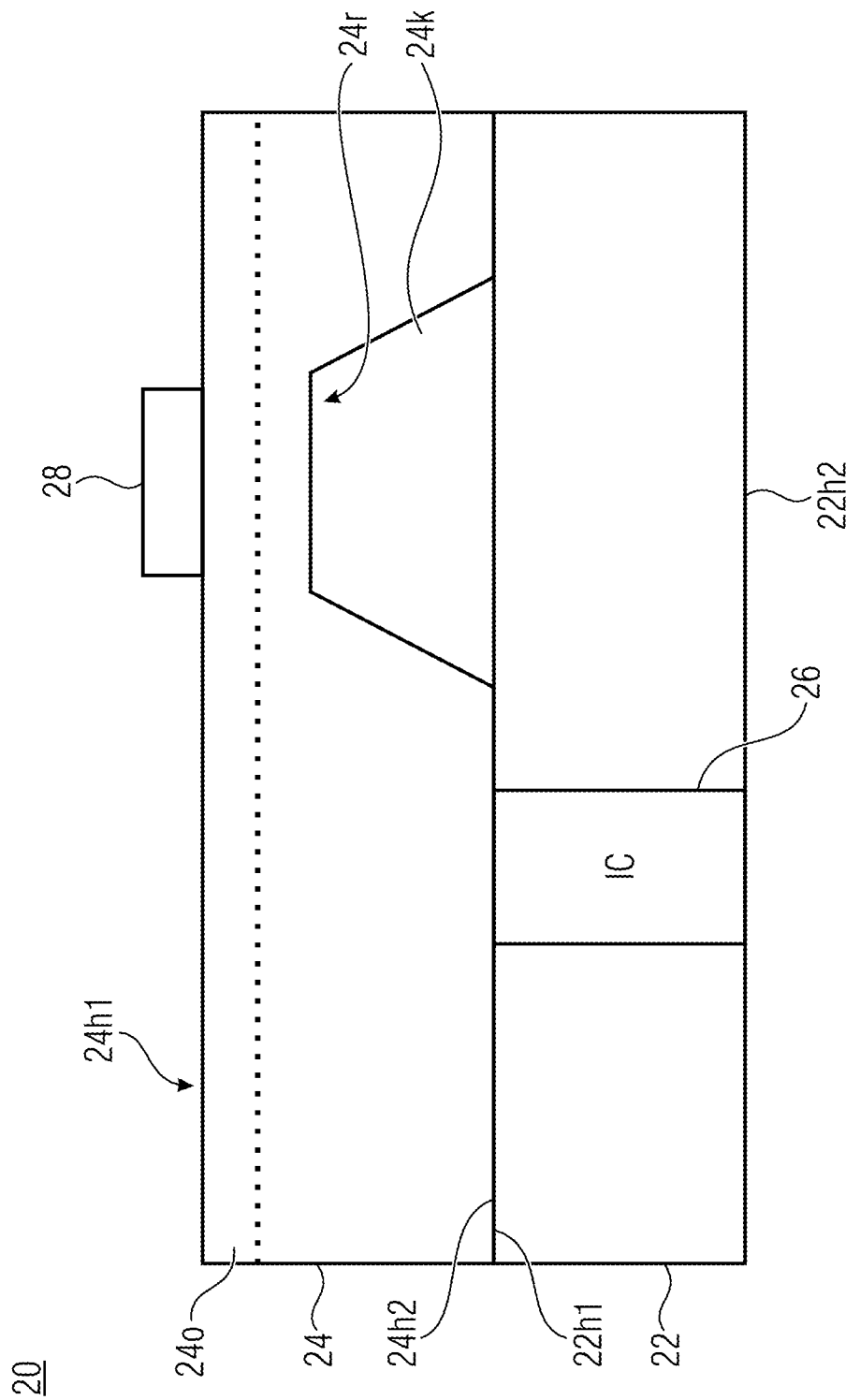
FIG. 1 shows a schematic block diagram of a module unit according to a base embodiment.

Before embodiments of the present invention are subsequently explained in detail based on the accompanying figures, it is to be noted that structures and elements having the same effect are provided with the same reference numerals so that their description may be applied to each other or may be interchangeable.

FIG. 1 shows a module unit 20 having a carrier substrate 22 and an antenna substrate 24 in detail. The carrier substrate 22 comprises a first main surface 22*hl*. The antenna substrate also comprises a first main surface 24*hl* and a second main surface 24*h*2 which face one another. The antenna substrate 24 is connected to the main surface 22*h1* of the carrier substrate by means of its main surface 24*h2*, e.g. by means of bonding or other joining techniques.

The carrier substrate 22 comprises an embedded chip such as an integrated circuit for processing RF signals (i.e. an RF chip) provided with reference numeral 26. Herein, embedded is to be understood in such a way that no hollow space is created in the carrier substrate 22. For example, this may be achieved by manufacturing the chip 26 directly in the carrier 22 during processing. Because the chip 26 is embedded, i.e. integrally connected to the carrier 22, the service life may be increased; furthermore, connection problems may be prevented since the chip 26 and the carrier substrate 22 essentially comprises the same materials and therefore also the same expansion coefficients.

The antenna substrate 24 comprises one or several antenna structures 28. Advantageously, but not necessarily, these antenna structures are arranged in an area that is not laterally aligned with the chip 26. The antenna structure 28 is formed on the main surface 24*h1* of the antenna substrate or is embedded into this surface. A cavity 24*k* is provided to be aligned with the antenna structure 28 in the antenna substrate 24. This cavity 24*k* represents an opening from the second main surface 24*h2* and therefore extends from the opposite side towards the antenna structure 28.

Advantageously, both substrates 22 and 24 comprise the same materials, e.g. a semiconductor material (Si, GaAs or the like) or a glass material. Due to the fact that the two materials are advantageously selected to be identical, their thermal expansion coefficients are also identical, so that thermal, or mechanical, tensions do not arise between the two substrates 22 and 24, which is advantageous with regard to durability. The background to this is that RF applications typically need a high energy density so that thermal expansions may arise in the area of the IC 26, for example.

As to the IC 26, it is to be noted that it advantageously extends across the entire thickness of the substrate 22, so that it may be contacted from the bottom side (cf. the second main surface 22*h2*). Additionally, it would also be conceivable to provide a cooling body or a coolant on this second main surface 22*h2* in the area of the chip 26.

As to the cavity 24*k*, it is to be noted that it advantageously protrudes as deeply as possible into the substrate 24 (from the main surface 24*h2*) so that the base material area (cf. reference numeral 24*r*) is implemented as thinly as possible. This has the technical effect that the electromagnetic radiation emitted by the antenna element 28 is affected as little as possible by the substrate material, particularly in the area 24*r*. Here, to further decouple the antenna element 28 from the substrate 24, according to further optional embodiments, a polymer or oxide layer 24*o* of the substrate 24 may be understood to be provided. This oxide layer 24*o* is provided between the base material of the substrate 24 and the antenna structures 28.

According to further embodiments, the chip 26 electrically contacts the antenna structures 28. For this, there are fundamentally two different approaches, i.e. direct electric contacting, e.g. through vias providing the vertical electric connection and, e.g., protruding through the antenna substrate 24. Alternatively, it would also be conceivable to provide electromagnetic coupling of the antenna structure 28. For this, e.g. in an area that is aligned with the antenna substrate 28, a so-called feeding element performing electromagnetic coupling would be provided. Since, as is also illustrated herein, the IC 26 is typically or also advantageously offset with regard to the antenna 28, according to further embodiments, a redistribution plane may be provided, e.g., on the main surface 22*h* of the carrier substrate 22. This redistribution plane enables the electric contacting, in the lateral sense, in the two elements 26 and 28. To return to the electromagnetic coupling, this redistribution plane may comprise the so-called feeding line. The redistribution plane is not restricted to only one sheet, but may also be implemented with several sheets, in order to realize a ground line or a shielding, for example. At this point, it is also to be noted that the redistribution plane does not necessarily have to be used for connecting the elements 26 and 28, but may also be arranged to connect other components, e.g. both arranged in the substrate 22. Referring to the subsequent figures, detailed embodiments will now be explained.

In the embodiments of FIGS. 2*a* to 2*e*, it is assumed that both the carrier substrate and the antenna substrate 22', or 24', consist of a semiconductor such as silicon, or include silicon. Furthermore, it is assumed that the antenna substrate 24' comprises a thin polymer or oxide sheet 240' on the side facing away from the carrier substrate.

Figure 2A:
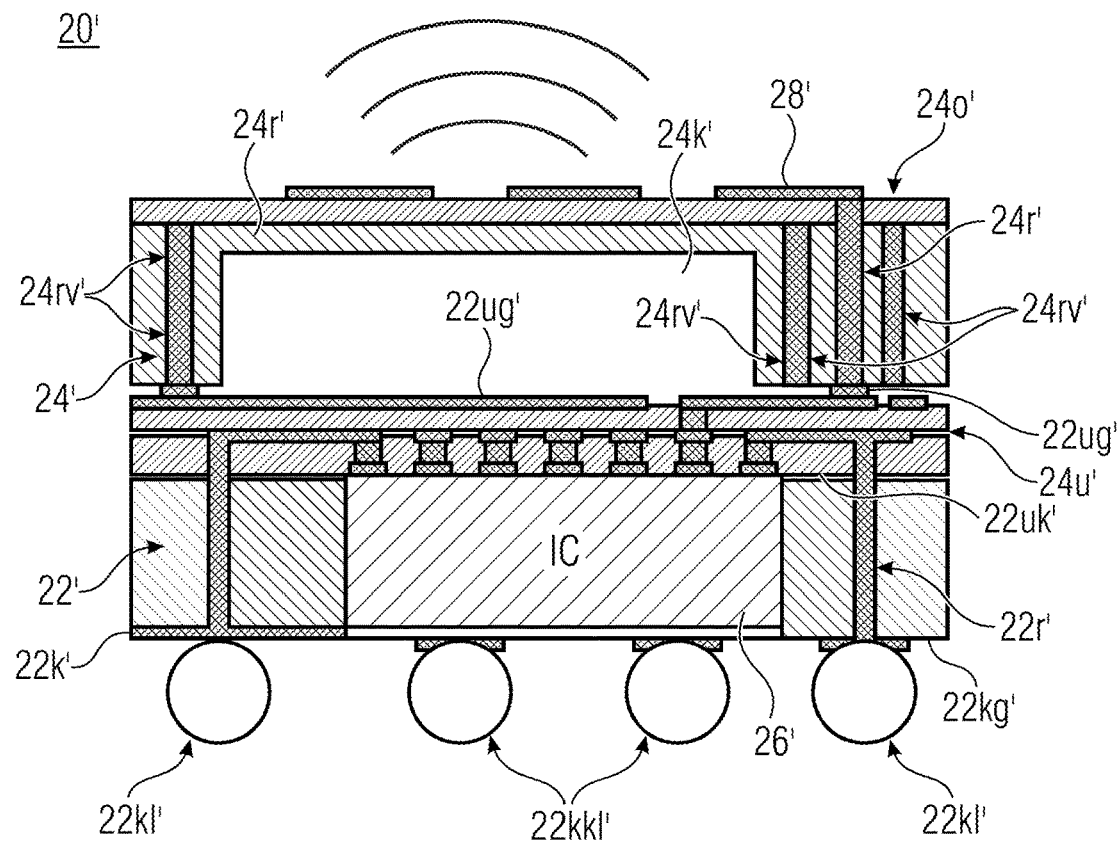
FIGS. 2a-e show schematic illustrations of module units based on semiconductor materials without superstrates according to embodiments.

FIG. 2*a* shows a module unit 20' having the carrier substrate 22' and the antenna substrate 24' implemented as a layer stack. The antenna substrate 24' comprises the oxide or polymer sheet 240'. An antenna structure 28' extending across a large lateral width of the substrate 24' (overlapping the IC 26') is provided on the top side (non-connection side) of this oxide or polymer sheet 240'. The cavity 24*k*' that fills out a significant volume proportion of the base material of the antenna substrate 24' herein is provided below (i.e. within the substrate 24'). The depth of the cavity 24*k*' is selected such that a remaining area 24*r*' of the base material of the antenna substrate 24' remains below the antenna structure 28'.

On the side of the antenna substrate 24', the carrier substrate 22' comprises a redistribution plane 22*u*' having several sheets. The redistribution plane 22*u*' comprises direct contacts to the chip 26'. Herein, the chip 26' is again embedded, i.e. processed and/or formed in the base material (silicon) of the carrier substrate 22', for example. These contacts are provided with reference numeral 22*uk*'. In a further plane of the redistribution layer 22*u*', e.g., a ground shield 22*ug*' is provided. This ground shield 22*ug*' overlaps with the cavity 24*k*', or the antenna structures 28', and therefore serves for shielding the chip 26' and other embedded components (e.g. passive elements such as capacitance and inductance) against the electromagnetic radiation emitted by the antenna structure 28'. For example, the redistribution plane 22*u*' may include an oxide or a dielectric which insulates the individual metal planes from each other.

A so-called contacting plane 22*k*' is provided on the second main surface 22*h*' of the carrier substrate 22'. For example, this contacting plane 22*k*' may include solder balls 22*kl*' or other connection means by which the element 20' may be electrically contacted from an external point, i.e. from a PCB board, for example. In the area of the chip 26', contacting may also take place by means of such solder balls 42*kl*'. Alternatively, it would also be conceivable that heat dissipation takes place via these solder balls 22*kl*' in the area of the chip 26'. These solder balls are provided with the separate reference numeral 22*kkl*'. In addition, according to further embodiments, elements 22*kl*' designed as cooling means may be provided in the area of the chip 26'. In order to electrically couple this contacting plane 22*k*' to the chip 26' (for base supply or signal distribution), direct contacting may take place via the bottom side, or contacting may also take place via the redistribution plane 22*uk*'. So-called vias 22*v*' that connect the redistribution plane 22*uk*' to the contacting plane 22*k'* are provided for this. These vias 22*v'* are provided next to the chip 26'.

In order to enable electric contacting of the chip 26' and the antenna structure 28' via the redistribution plane 22*u'*, in this embodiment, contacting takes place via a single via 24*v'* which extends through the antenna substrate 24'. The signal via 24*v'* is arranged next to the cavity 24*k'*. Next to the signal via 24*v'*, so-called shielding vias or return vias 24*rv'* are provided. These optional elements may either be arranged between the cavity 24*k'* and the signal via 24*v'* and/or on the opposite side. According to an alternative embodiment, an arrangement around the signal via 24*v'* would also be possible so that the return vias 24*rv'* enclose the signal via 24*v'* like a coaxial cable. On the one hand, the return vias 24*rv'* have the purpose of shielding, and on the other hand, also the purpose to correspondingly distribute the ground. In detail: particularly the vias 24*rv'* next to cavity 24*k'* serve for shielding the electromagnetic radiation emitted by the antenna structure 28' against the rest of the chip. According to additional embodiments, it would also be conceivable to enable coupling of a reflector 22*ug'* (part of the redistribution plane 22', or part of the ground plane 22*ug'*) through this return via 24*rv'* (particularly the return via 24*rv'* on the side opposing the signal via 24*v'*).

At this point, it is to be noted that objects that are additionally explained in contrast to the embodiment of FIG. 1, e.g. the redistribution plane 22*u'*, the contacting plane 22*k'*, the vias 22*v'*, 24*v'* and 24*rv'*, do not necessarily need each other, so that their description may also be understood to be individual. For example, it is to be noted that the signal via 24*v'* may easily be operated without the return vias 24*rv'*. At this point, it is also to be noted that the contacting plane 24*k'* may also be implemented such that it manages without the vias 22*v'*, e.g. when the entire contacting takes place via the bottom side of the chip 26'. Vice versa, it is not mandatory for the chip 26' to be contacted via the bottom side. An embedding may also only be present if the chip 26' does not necessarily protrude down to the bottom side 22*h'*.

Subsequently, further embodiments are explained with reference to FIGS. 2*b*-2*e*, essentially illustrating a variation of the embodiment of FIG. 2*a*.

Figure 2B:
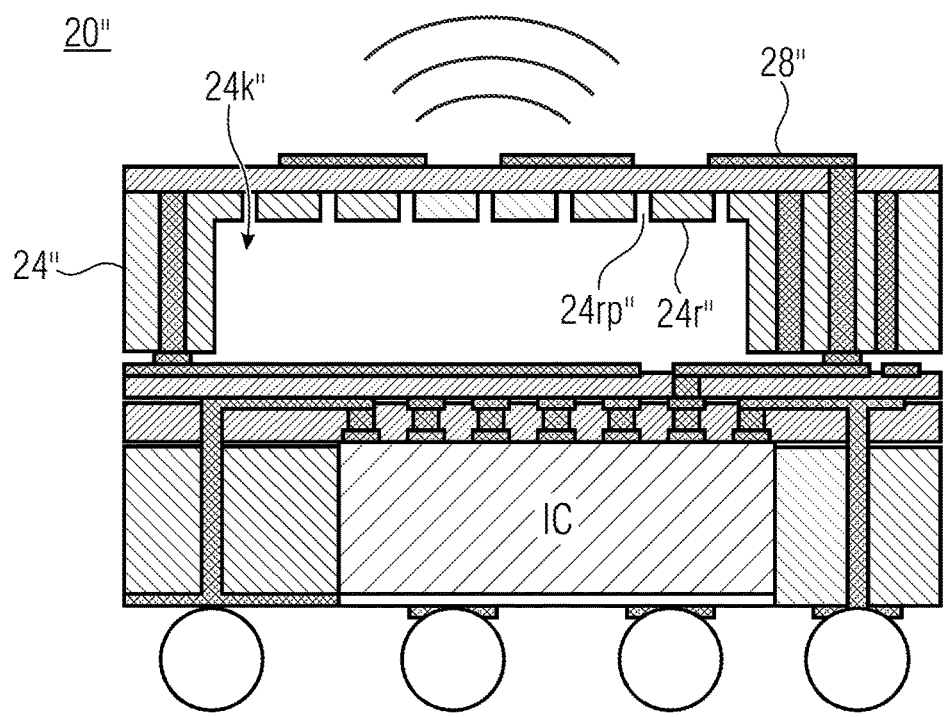

FIG. 2*b* shows a module unit 20" that essentially corresponds to a module unit 22', however, the area 14*r"* (the area between the antenna structure 28' and the cavity 24') being perforated. These perforations are provided with the reference numeral 24*rp"*. This perforation has the purpose that the electromagnetic radiation emitted by the antenna structure 28" may be affected in its characteristic, e.g. by filtering. In addition, the perforation leads to a reduction of the effective dielectric constant. This effects the dimensions and the electric performance of the antenna.

Figure 2C:
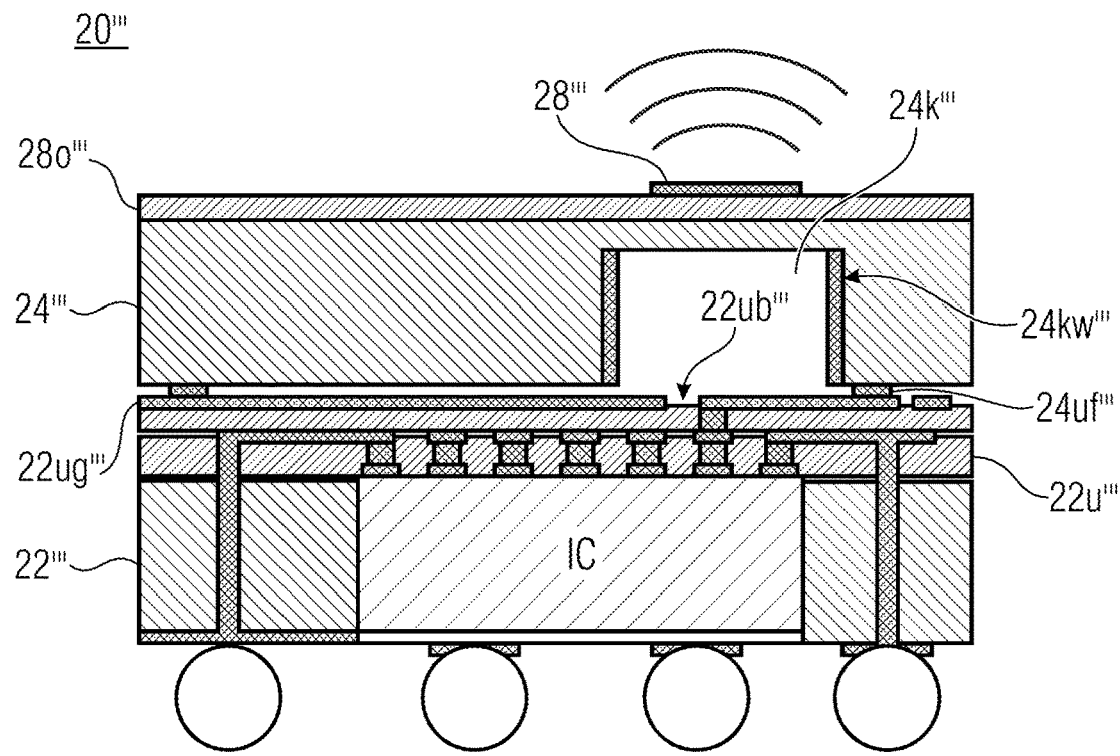

The embodiment of the module unit 20''' of FIG. 2*c* comprises a carrier substrate 22''' that is comparable to the embodiments of FIGS. 2*a* and 2*b*, however, the antenna substrate 24''' being implemented in a different manner. The antenna substrate 24''' illustrated herein also comprises one or several antenna structures 28''' on the exposed top side, or to be concise, on the oxide/polymer sheet 24". It is to be noted that only one antenna element 28''' is illustrated herein, however, this may also be implemented as an array. The antenna element 28''' is again provided in the area of the cavity 24*k'''*, however, in this case the same is implemented in a smaller manner. The antenna substrate 24''' does not comprise any vias for signal coupling since here the coupling takes place in an electromagnetic manner. For this, a so-called feeding line 22*uf'''* outputting an electromagnetic signal through an aperture 22*ub'''* towards the antenna element 28''' and, in a manner of speaking, coupling in the same, is provided in the redistribution plane 22*u"*. The aperture 22*ub'''* and the feeding line 22*uf'''* as well as the antenna element 28''' are provided in the area of the area of the cavity 24*k'''* (to be aligned with the same). At this point, it is to be noted that, in case that several antenna elements 28''' are provided as an array, e.g., each antenna element 28''' may be supplied by means of its own feeding line 22*uf'''*, or its own aperture 24*ub'''*, in the ground sheet 22*ug'''*. In order to improve the coupling, or the electromagnetic performance in general, the wall of the cavity 24*kw'''* may be metallized. This metallization (ground sheet 22*ug'''*) serves for shielding.

Figure 2D:
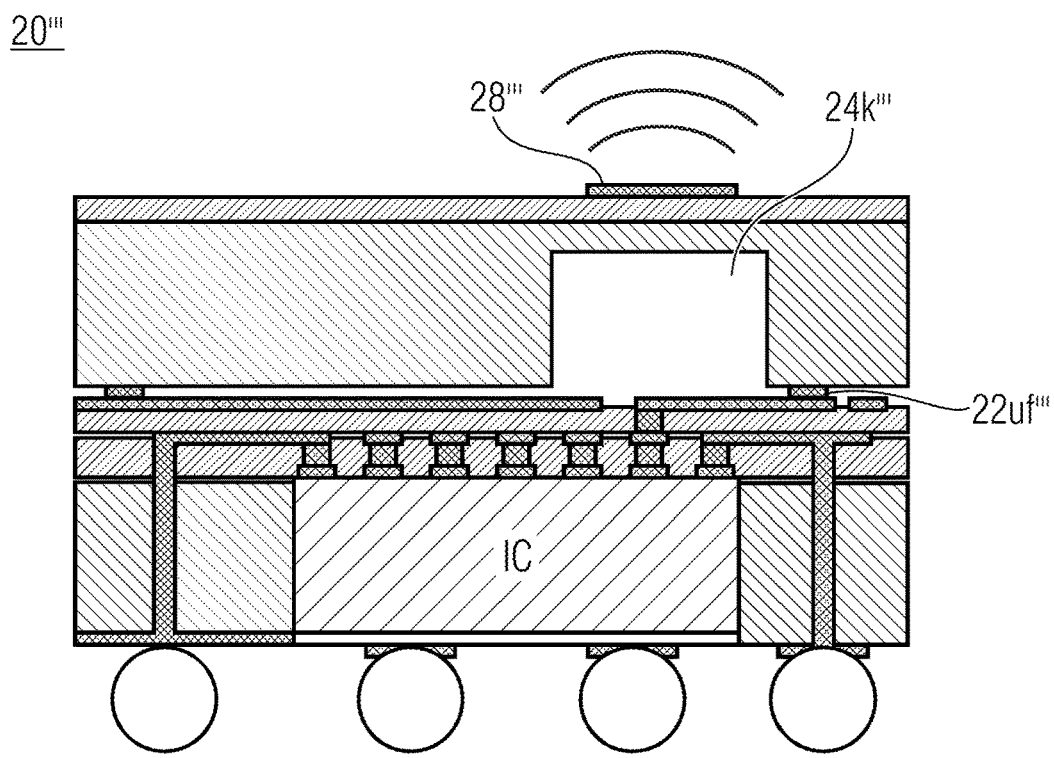

As is illustrated in FIG. 2*d*, however, this metallization 24*kw'''* is optional since electromagnetically coupling the feeding line 22*uf'''* into the antenna element 28''' may also take place without the metallization.

Figure 2E:
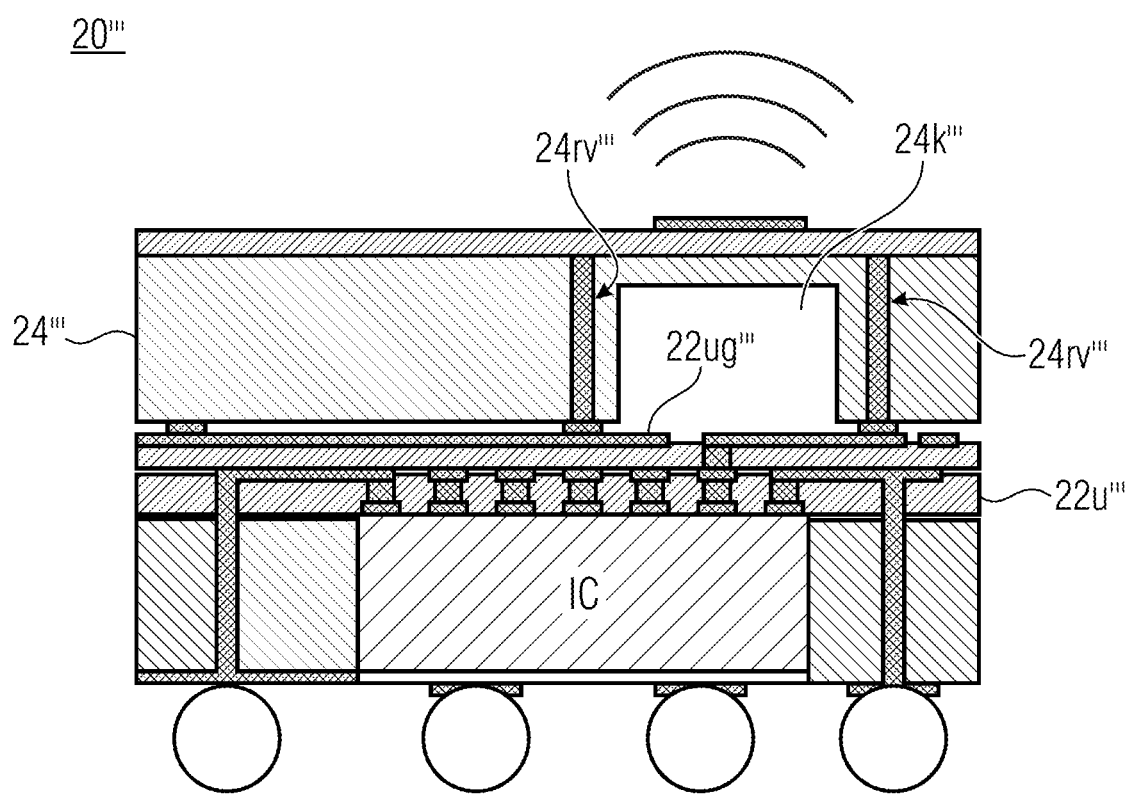

The embodiment illustrated in FIG. 2*e* is comparable to the module unit 20''' of FIG. 2*d* (without the metallization), wherein, in order to improve the shielding, shielding vias 24*rv'''* may be provided next to the cavity 24*k'''* in the antenna substrate 24''', said shielding vias being connected to (e.g. the ground 22*ug'''* of) the redistribution plane 22*u"*. As in the shielding according to further embodiments, these shielding vias 24*rv'''* also have a further function, i.e. to form the cavity around the antenna 28".

Figure 3A:
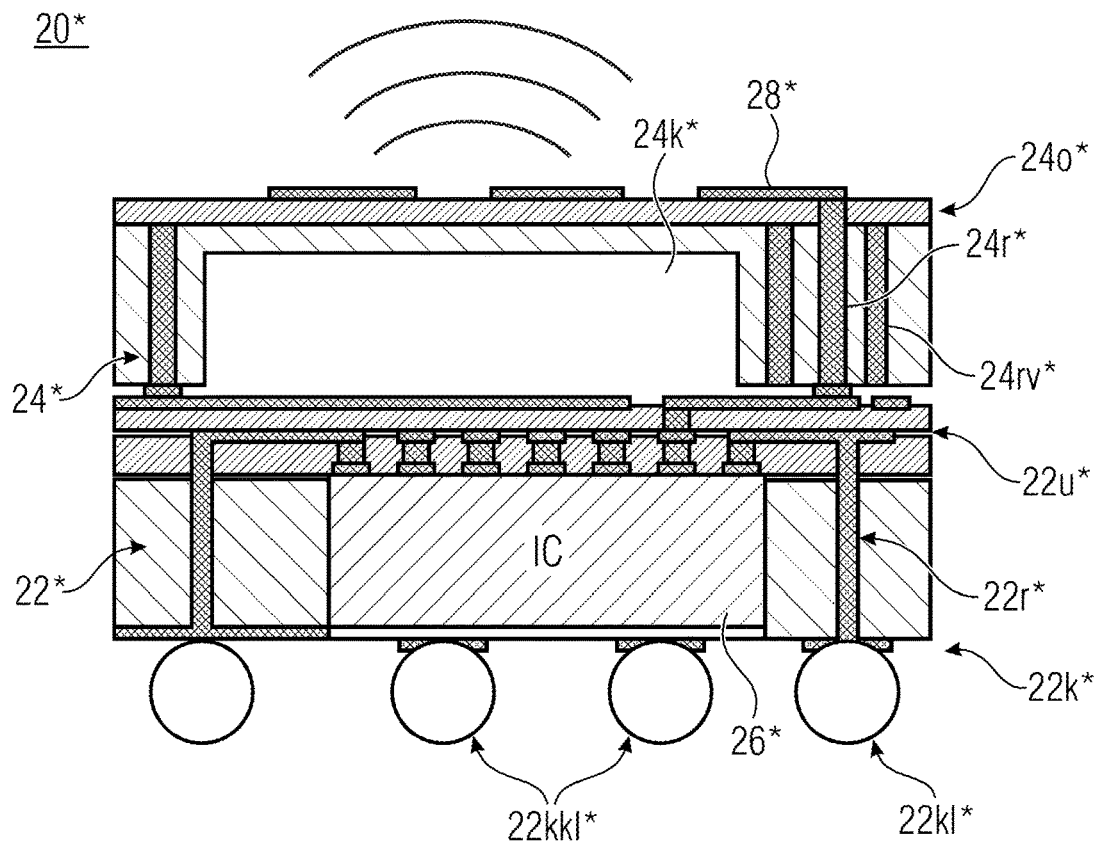
FIGS. 3a-3h show schematic illustrations of module units based on glass materials with and without superstrates according to embodiments.

Now, with reference to FIGS. 3*a*-3*h*, embodiments in which the base material for carrier substrates and antenna substrates is glass are explained. FIG. 3*a* shows a module unit 20* in which the carrier substrate 22* corresponds, with respect to the structural design, to the carrier substrate 22' of FIG. 2*a*, however, the base material being glass. The antenna substrate 24* also corresponds to the antenna substrate 24' of FIG. 2*a* with respect to its structure, however, glass again being selected as the base material.

Analogously to the carrier substrate 22', the carrier substrate 22* comprises a redistribution plane 22*u** and a contacting plane 22*k**. This contacting plane 22*k** having the solder balls 22*kl**, or solder balls 22*kkl**, configured to dissipate heat generated in the module, is arranged on the surface of the carrier element 22* facing away from the antenna substrate 24* and serves for contacting the entire element 20*. For this, the contacting plane 22*k** may be connected to the redistribution plane 22*u** by means of vias 22*v** through the base material.

Figure 3B:
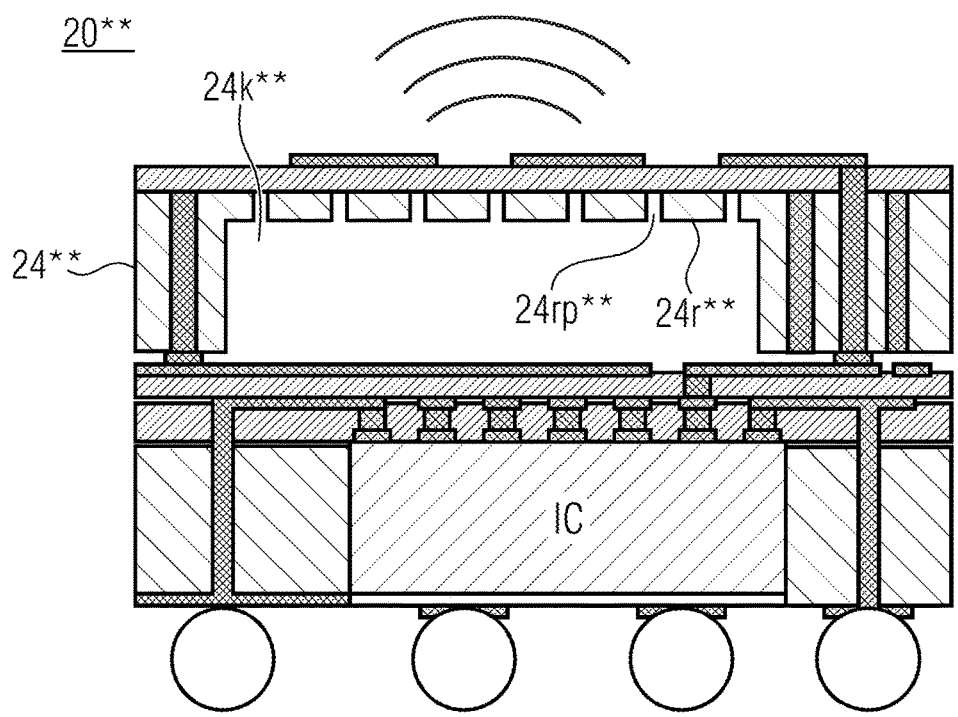

The antenna substrate 24*, which comprises glass as its base material, includes on the side facing away from the carrier substrate 22* again the polymer sheet 24*o**, on which the antenna structure 28* is arranged. The cavity 24*k** is introduced in the glass in the area below the antenna structure 28*. Contacting the antenna structure 28* takes place directly by means of one or several signal vias 24*v**, wherein additional shielding vias 24*rv** may be provided. FIG. 3*b* shows a module unit 20** corresponding to the module unit 20*, wherein here, as described with reference to FIG. 2*b*, the base material 24*r* of the antenna substrate 24 is perforated in the area of the cavity 24*k*** (cf. perforation structures 24*rp***).

Figure 3C:
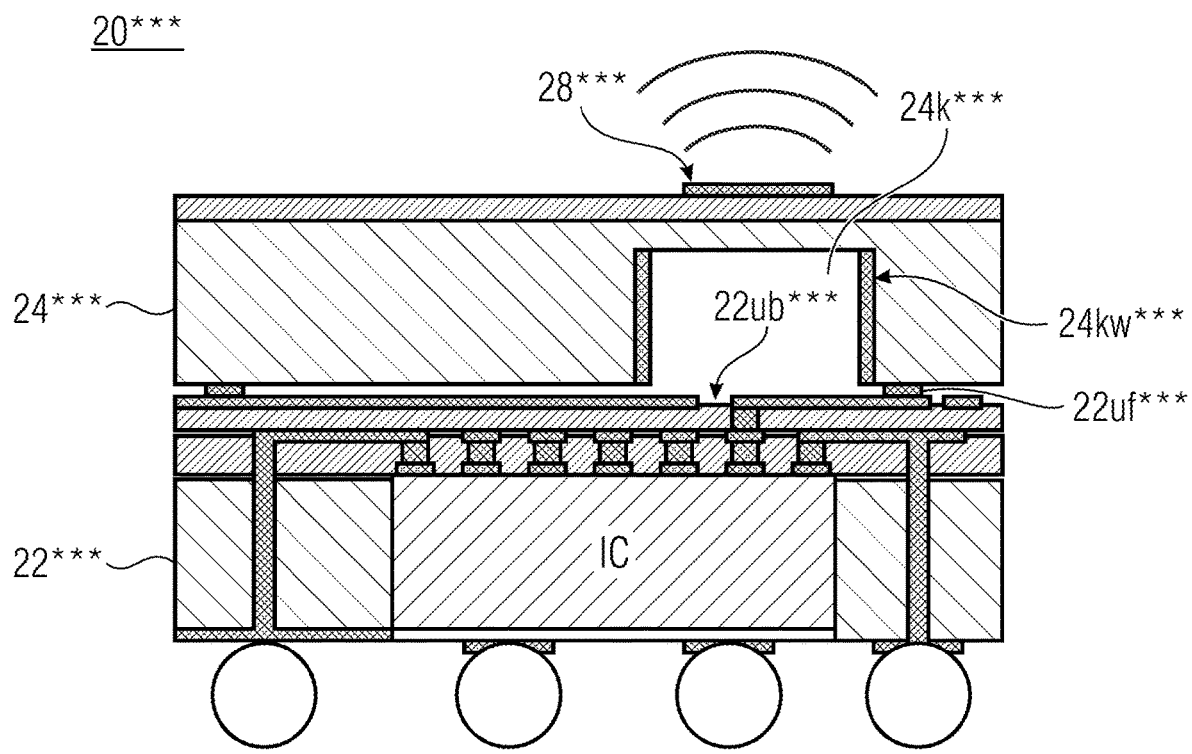
Figure 3D:
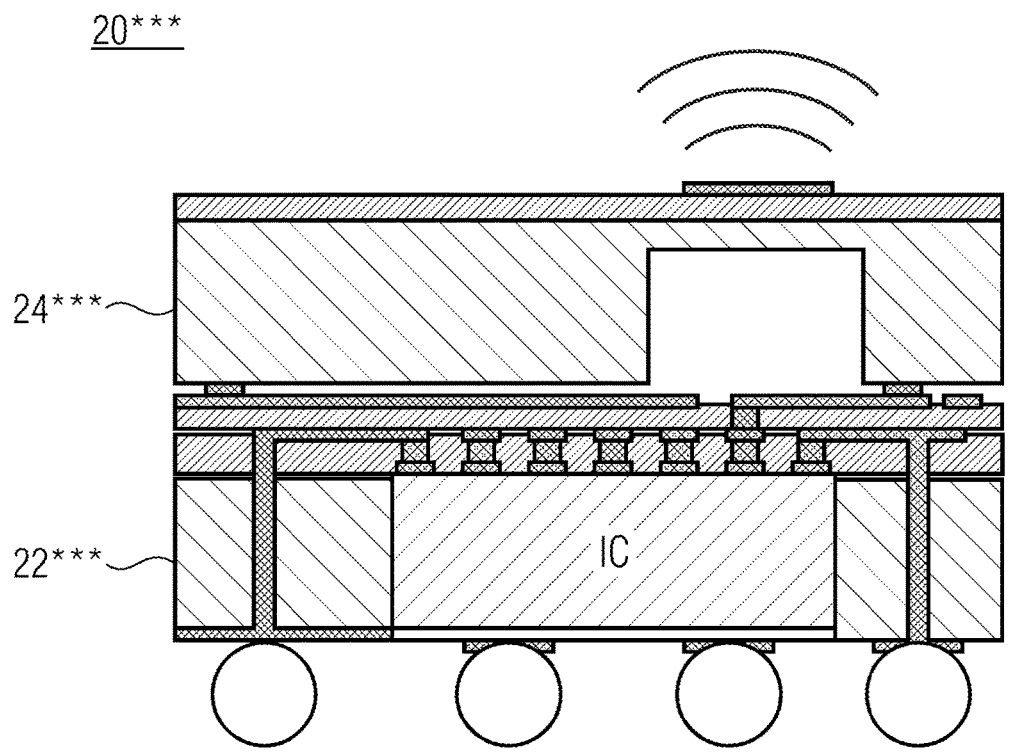

The embodiments 20*** of FIGS. 3*c* and 3*d* are comparable to the embodiments 20''' of FIGS. 2*c* and 2*d*, however, glass being used here as a base material for the antenna substrate 24* and the carrier substrate 22*. Thus, based on the embodiments of FIGS. 3*c* and 3*d*, it becomes obvious that the electromagnetic coupling from the feeding line 22*uf**** through the opening 22*ub** (in the ground shield to the antenna 28) may also be realized with glass as the base material for the substrates 22* and 24*. At this point, it should also be noted that the cavity 24k* may be implemented with a metallization 24kw*** in the area of the wall (cf. FIG. 3c), however, this is not necessary (cf. FIG. 3d).

Figure 3E:
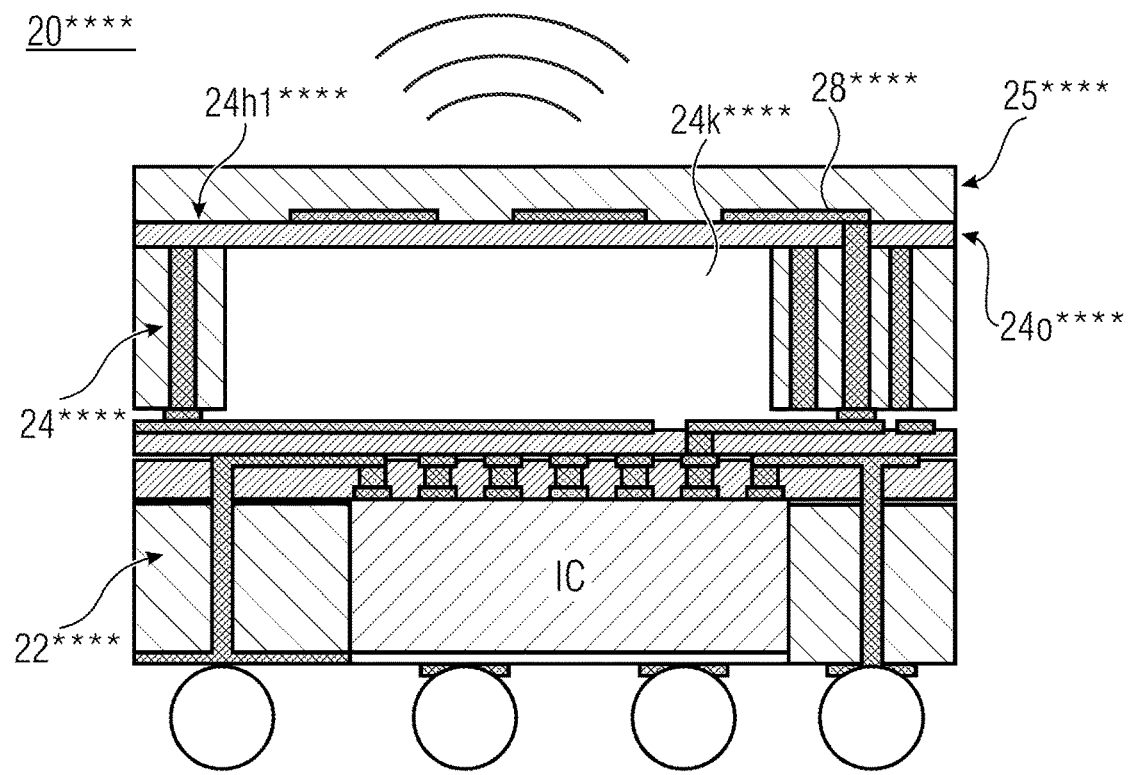
Figure 3F:
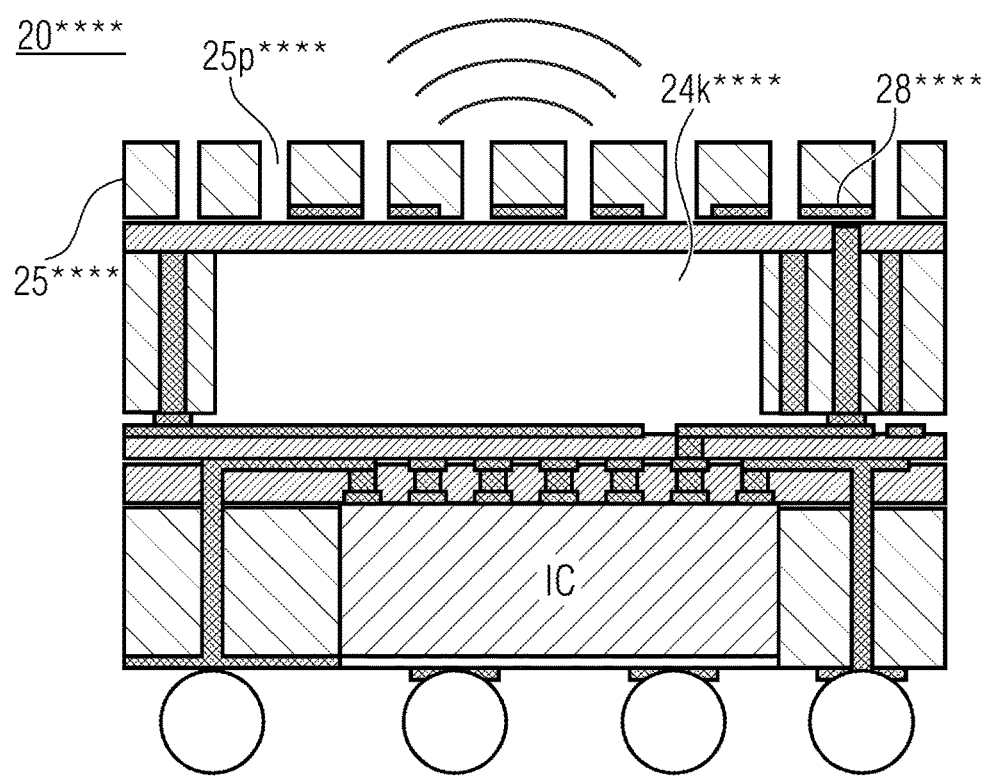

The embodiments of FIGS. 3e and 3f are based on the embodiments of FIGS. 3a and 3b. FIG. 3e shows a module unit 20**, wherein an additional glass sheet 25 is provided on the main surface 24hl, or on the antenna element 28. This glass sheet 25 is denoted as glass substrate. Regarding manufacturing, the antenna substrate 24 is built upon the glass sheet 25, wherein, due to the additional stability of the glass sheet 25, the cavity 24 protrudes down in its depth across the entire base material of the antenna substrate 24, so that the polymer material or the oxide layer 24o** is exposed or at least partially exposed.

In this embodiment, since the antenna substrate 24** may be identical to the antenna substrate 22*, e.g., the elements of the redistribution plane or the contacting plane are not further explained.

FIG. 3f shows an additional embodiment that essentially corresponds to the embodiment of FIG. 3e and is therefore also denoted with the same reference numeral 20**. In this embodiment, the cavity 24k is also configured such that no remainder of the base material of the antenna substrate 24 remains between the cavity 24k and the antenna structures 28. This has advantages with regard to the emission characteristics. Here, in order to further optimize the emission characteristics, perforation structures 25p are introduced into the superstrate glass substrate 25**.

Figure 3G:
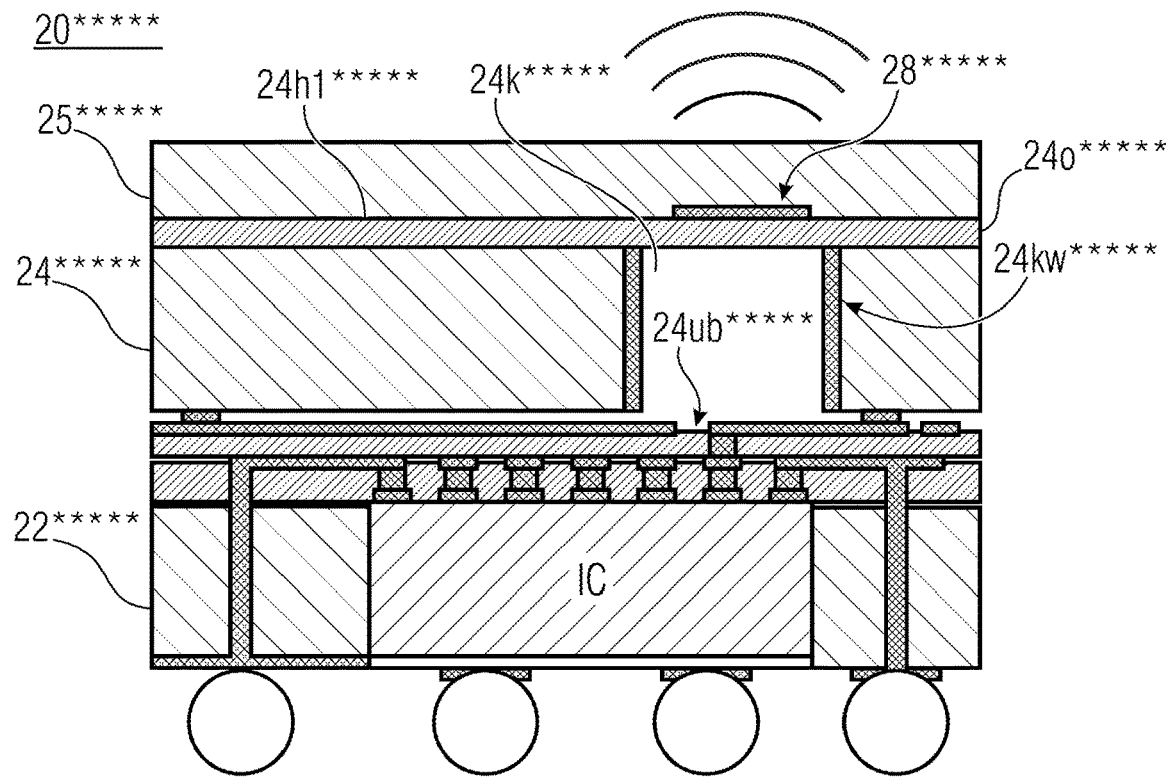
Figure 3H:
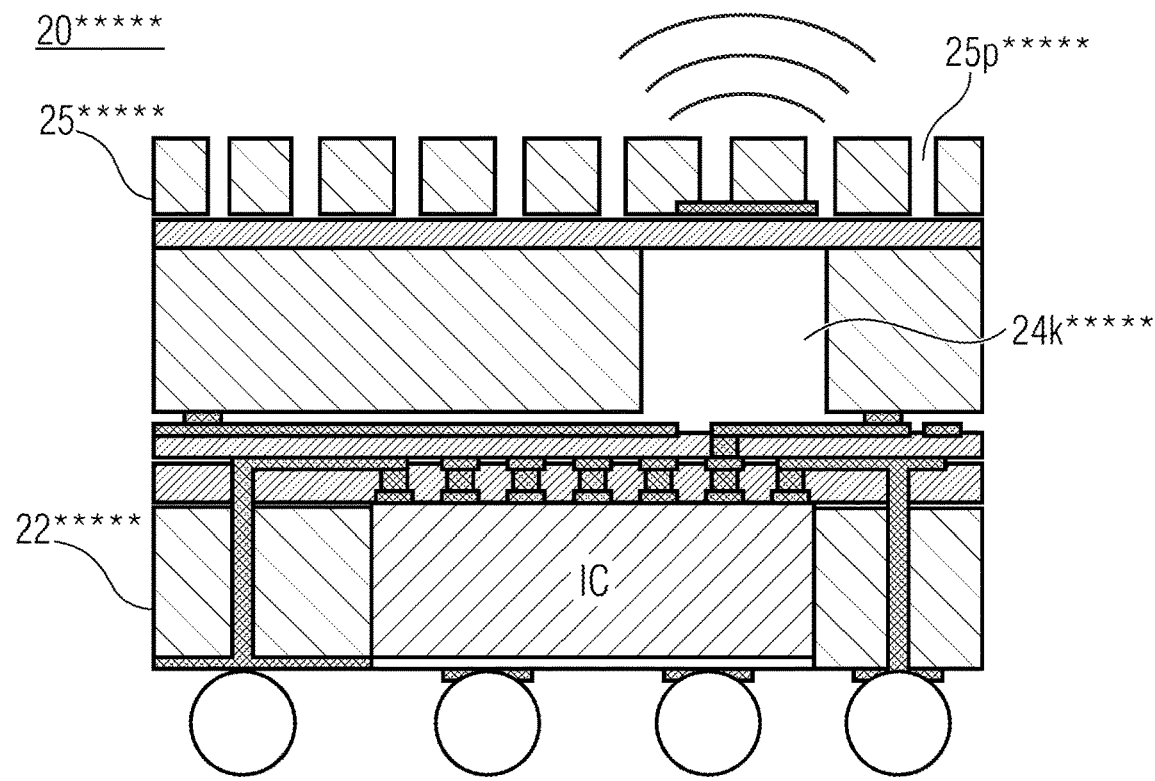

FIGS. 3g and 3h both show module units 20*** that are based on the embodiments 20* of FIGS. 3c and 3d. The module units 20*** comprise a carrier substrate 22* that is comparable, or identical, to the carrier substrate 22*. The carrier substrate is comparable, however, the cavity is configured in a slightly modified manner, i.e. the cavity 24k*** reaches down to the oxide/polymer sheet 24o*. In addition, the superstrate glass sheet 25* is applied to the antenna substrate 24*, or to be precise, onto the main surface 24h1* and/or the antenna structure 28*. In the embodiment of FIG. 3h, the glass sheet 25* comprises additional perforations 25p***.

Figure 4A:
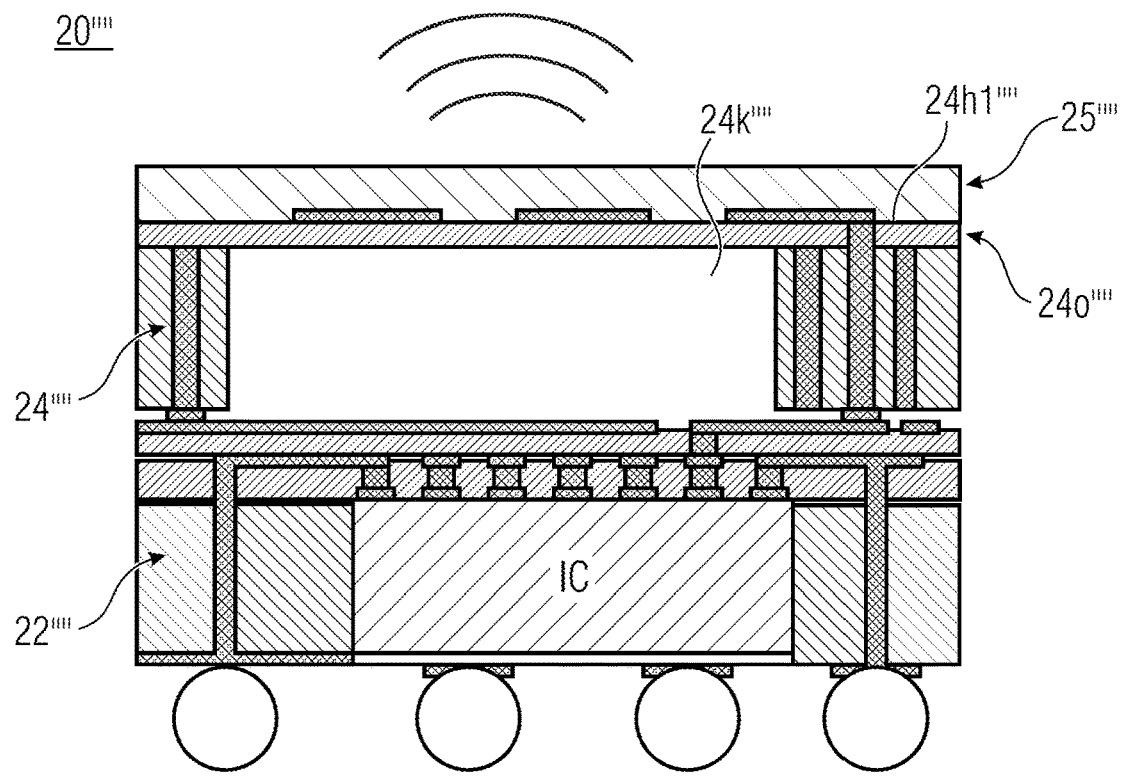
FIGS. 4a-4d show schematic illustrations of module units according to a hybrid approach with superstrates according to extended embodiments.
Figure 4B:
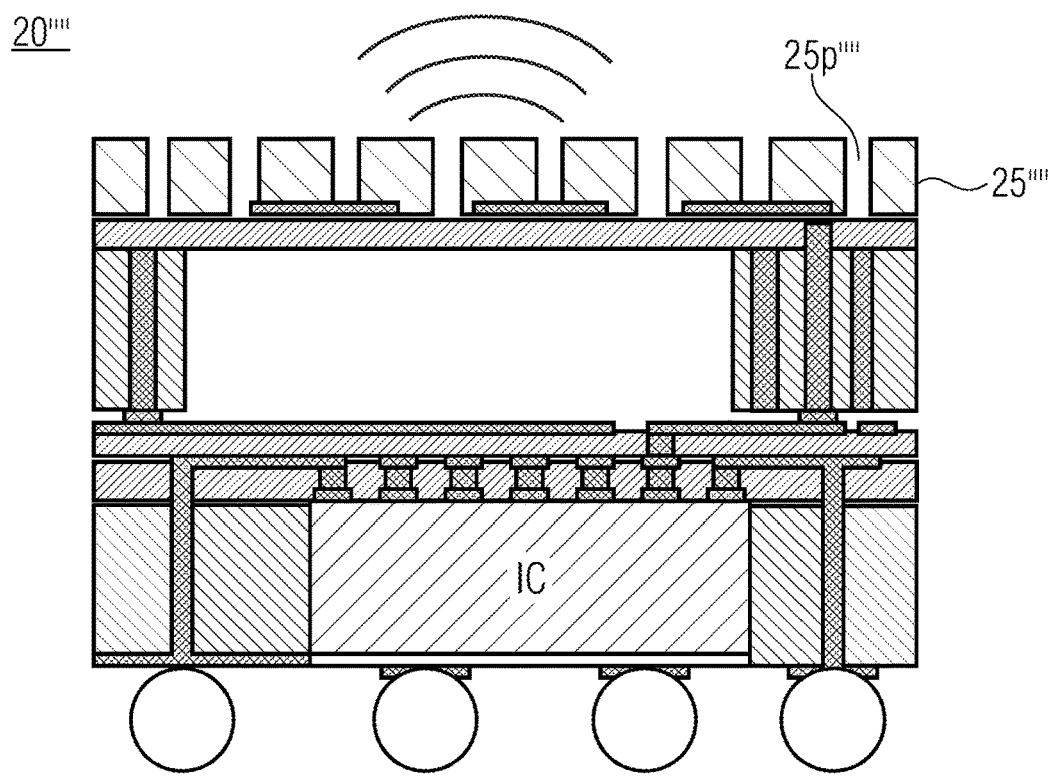

FIGS. 4a and 4b show further embodiments having superstrate glass substrates for supporting the antenna substrate.

FIG. 4a shows a module unit 20'''' that essentially matches the module unit 20', in particular with respect to the carrier substrate 22'''', however, the antenna substrate 24'''' is configured in a slightly modified manner. The antenna substrate 24'''' comprises a cavity 24k'''' which protrudes down to the polymer/oxide layer 24o''''. Additionally, as is explained in connection with the embodiments of FIGS. 3g and 3h, a glass layer (superstrate glass substrate 25'''') is provided on the main surface 24h1''''.

FIG. 4b also shows a module unit 20'''', wherein, in this embodiment, the glass layer 25'''' is additionally provided with perforations 25p''''.

Figure 4C:
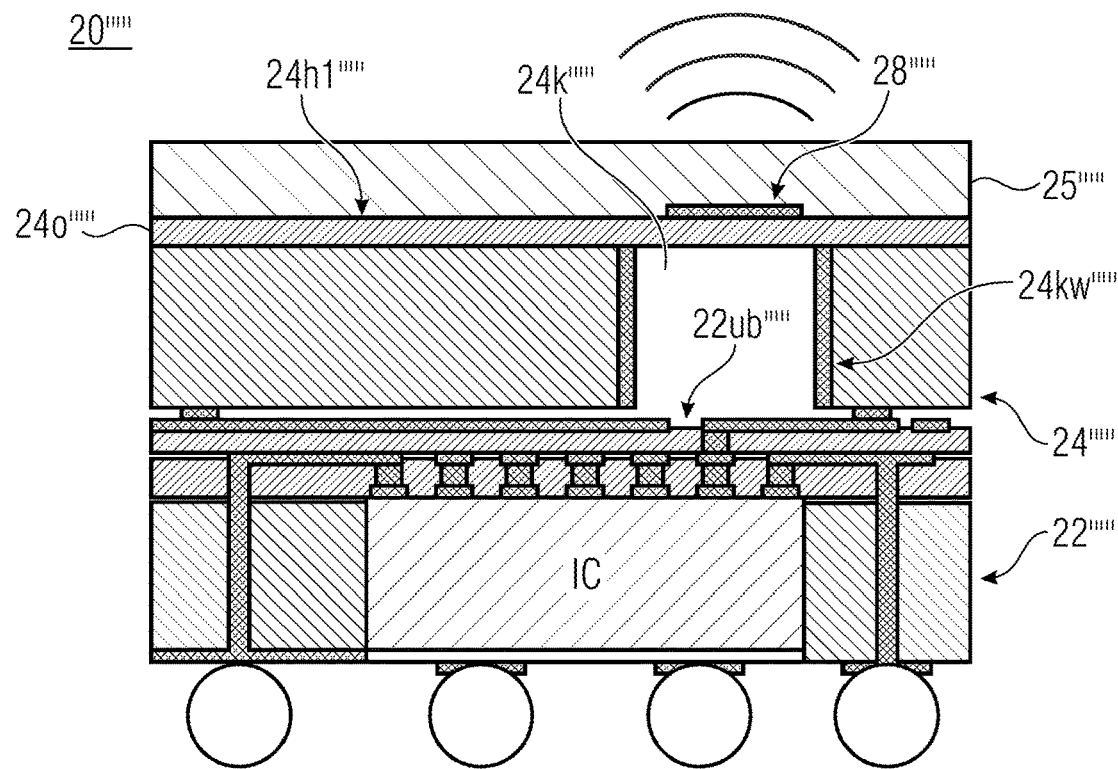
Figure 4D:
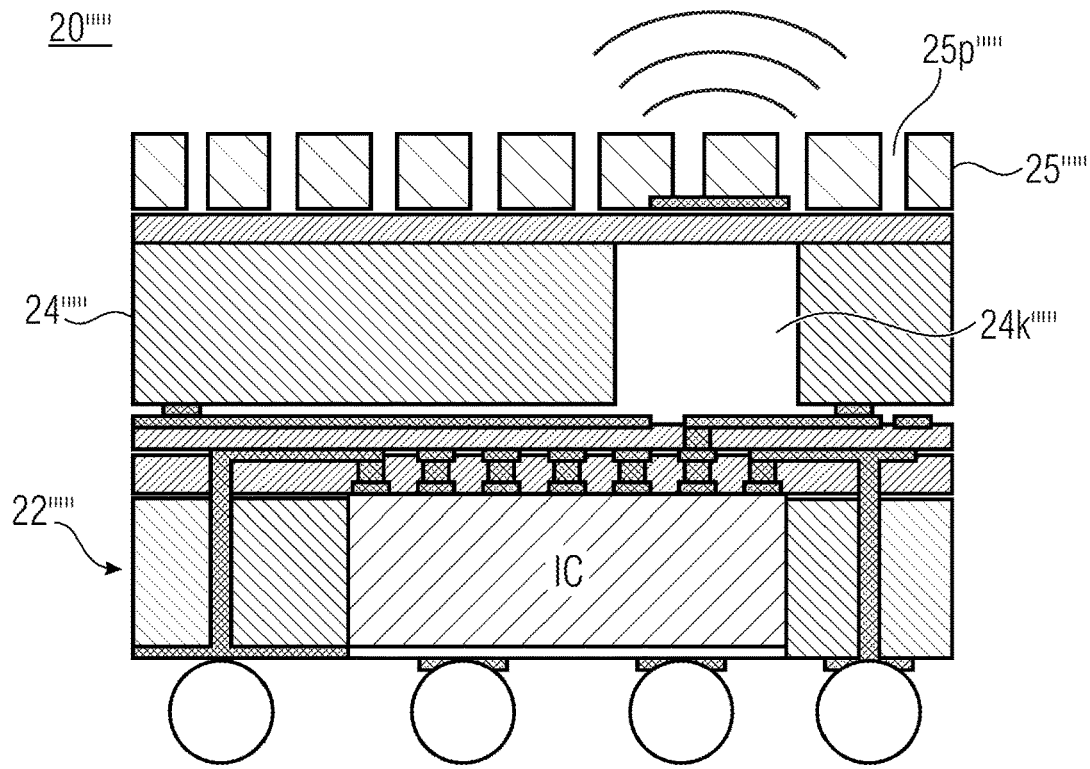

FIGS. 4c and 4d illustrates module units 20''''. These module units essentially correspond to the module units 20''' of FIG. 2c or 2d. The module unit 20'''' of FIG. 4c is comparable to the module unit 20''' of FIG. 2c, while the module unit 20'''' of FIG. 4d is comparable to the module unit 20''' of FIG. 2d. In particular, this is true for the selection of the base material, which here is a semiconductor material.

In both embodiments according to FIGS. 4c and 4d, the carrier substrate 22'''' is comparable the carrier substrate 22''. The antenna substrate 24'', which also includes the additional metallization 24kw'''' according to FIG. 2c, is fundamentally comparable to the antenna substrate 24'' of FIGS. 2c and 2d, however, the cavity 24k'''' is configured to deeper so that only the polymer sheet/oxide sheet 24o'''' is provided between the cavity 24k'''' and the antenna 28''''. In contrast to the arrangement of FIGS. 2c and 2d, the module units 20'''' illustrated here additionally comprise the superstrate glass substrate 25'''' on the first main surface 14h1''''. In the embodiment of FIG. 5d, this glass substrate 25'''' is additionally provided with optional perforations 25p''''. Based on the Si/semiconductor as the base material in combination with the superstrate glass substrate 25'''', this embodiment represents a hybrid approach of a semiconductor material and glass.

With respect to the superstrate glass substrate (reference numerals: 25'''', 25**, 25''''', 25***), it is generally to be noted that other superstrate materials such as a polymer may be used instead of glass. In general, the materials used are a dielectric, which is why this sheet is also referred to as a dielectric layer.

Figure 5A:
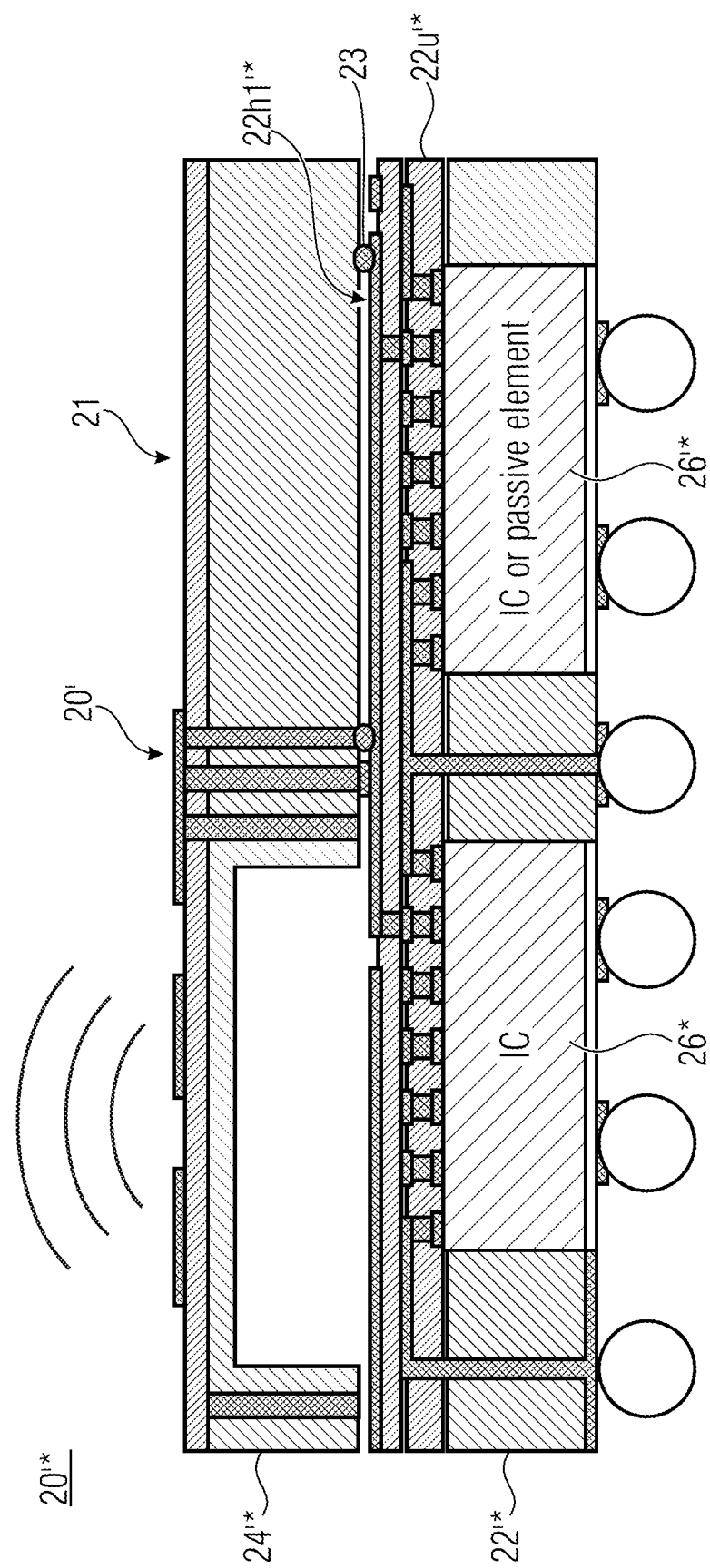
FIG. 5a shows a schematic illustration of a module unit according to a further embodiment.

FIG. 5a shows a module unit 20'* including the module unit 20', however, both the carrier substrate 22'* and also the antenna substrate 24'* are laterally elongated (cf. area 21). In area 21, the carrier substrate 22'* comprises a further chip 26'* or a passive element such as a coil next to the chip 26'. This further embodiment 26'* is coupled via the redistribution layer 22u'*.

As is illustrated here and also realized in all previous embodiments, the antenna substrate 24'* may be coupled to the carrier substrate 21'* via connection elements such as bonds or solder balls 23. These solder balls 23 are provided on the first main surface 22h1'*, e.g. in such a way that contacting the redistribution layer 22u'* may take place.

At this point, it is to be noted that the embodiment of FIG. 5 having the module unit 20'* may both be realized as a glass radiation or semiconductor variation: this means that the base material of the carrier substrate 22'* and the antenna substrate 24'* either includes glass in both instances or a semiconductor material such as silicon in both instances.

Figure 5B:
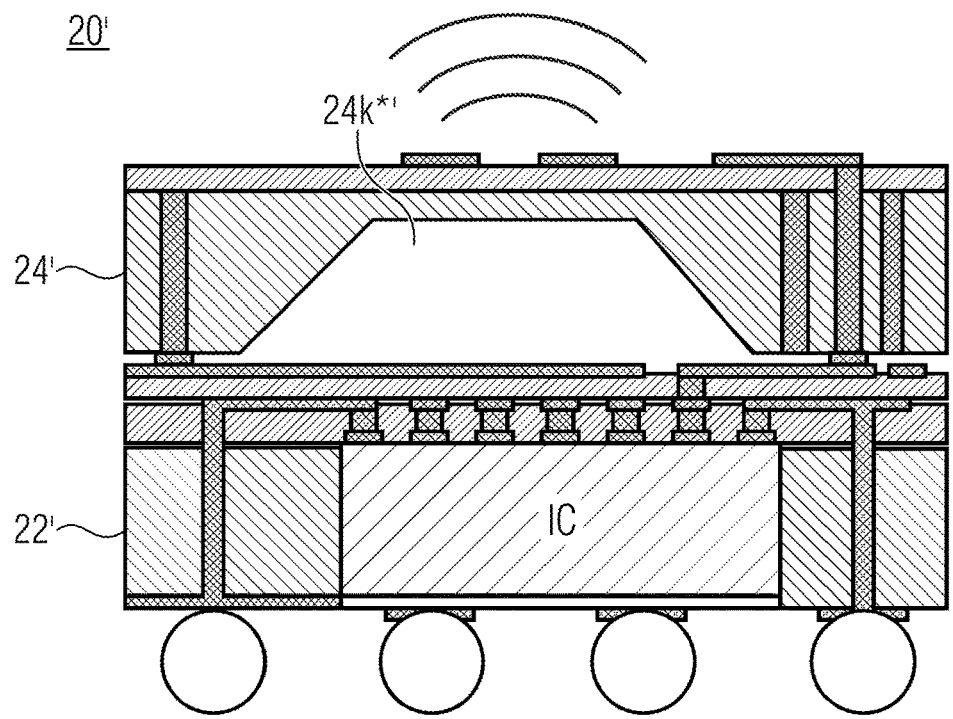
FIGS. 5b-5c show schematic illustrations of module units according to additional embodiments.

FIG. 5b shows an embodiment of a module unit 20' that is essentially identical to the module unit 20' of FIG. 2a. Thus, it comprises the carrier substrate 22' and the antenna substrate 24. However, in the antenna substrate 24, the cavity 24k*' is configured to be slightly modified. According to FIG. 2a, the cavity 24k' is configured with approximately perpendicular sidewalls, while here in FIG. 5b, the cavity 24k*' comprises inclined sidewalls. Generally speaking, according to embodiments, it is possible to use other shapes (ball shape or the like) as a cavity. For example, these variations depend on the etching technology used.

Figure 5C:
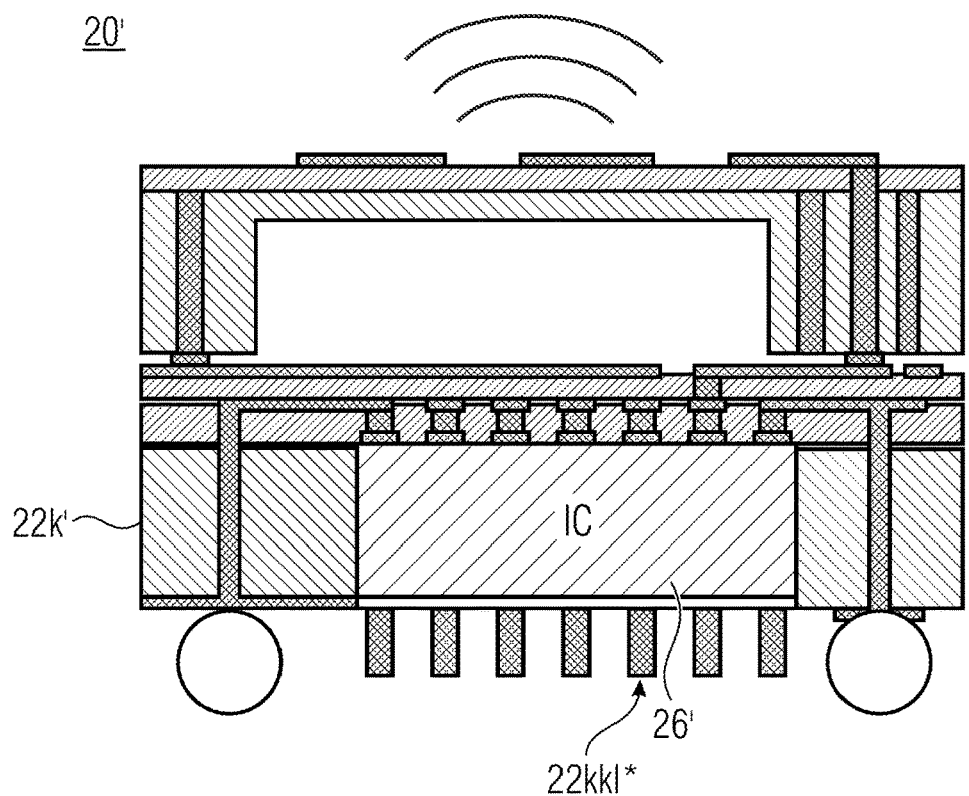
Figure 6A:
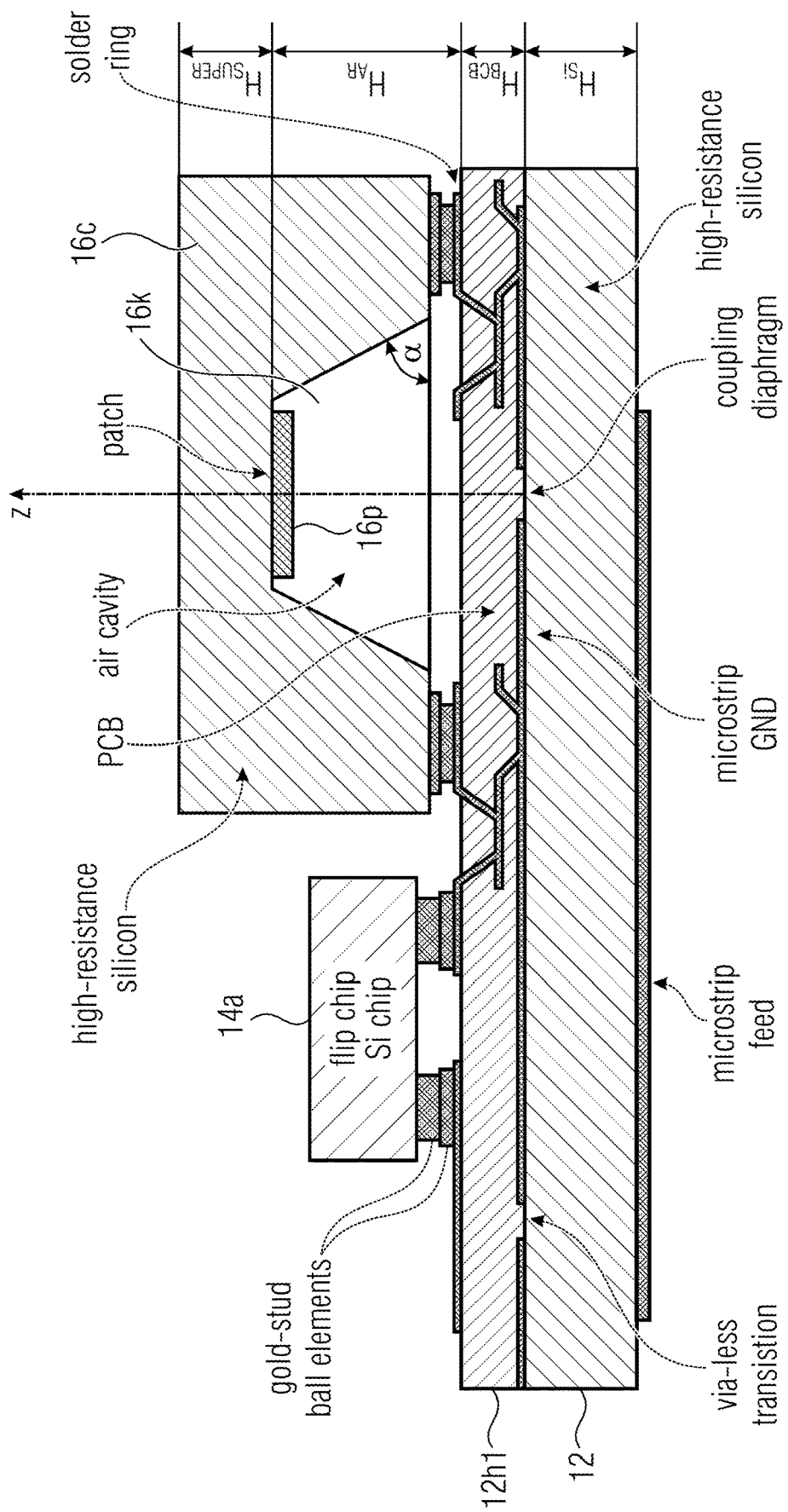
FIGS. 6a-6c show schematic illustrations of conventional technology solutions.
Figure 6B:
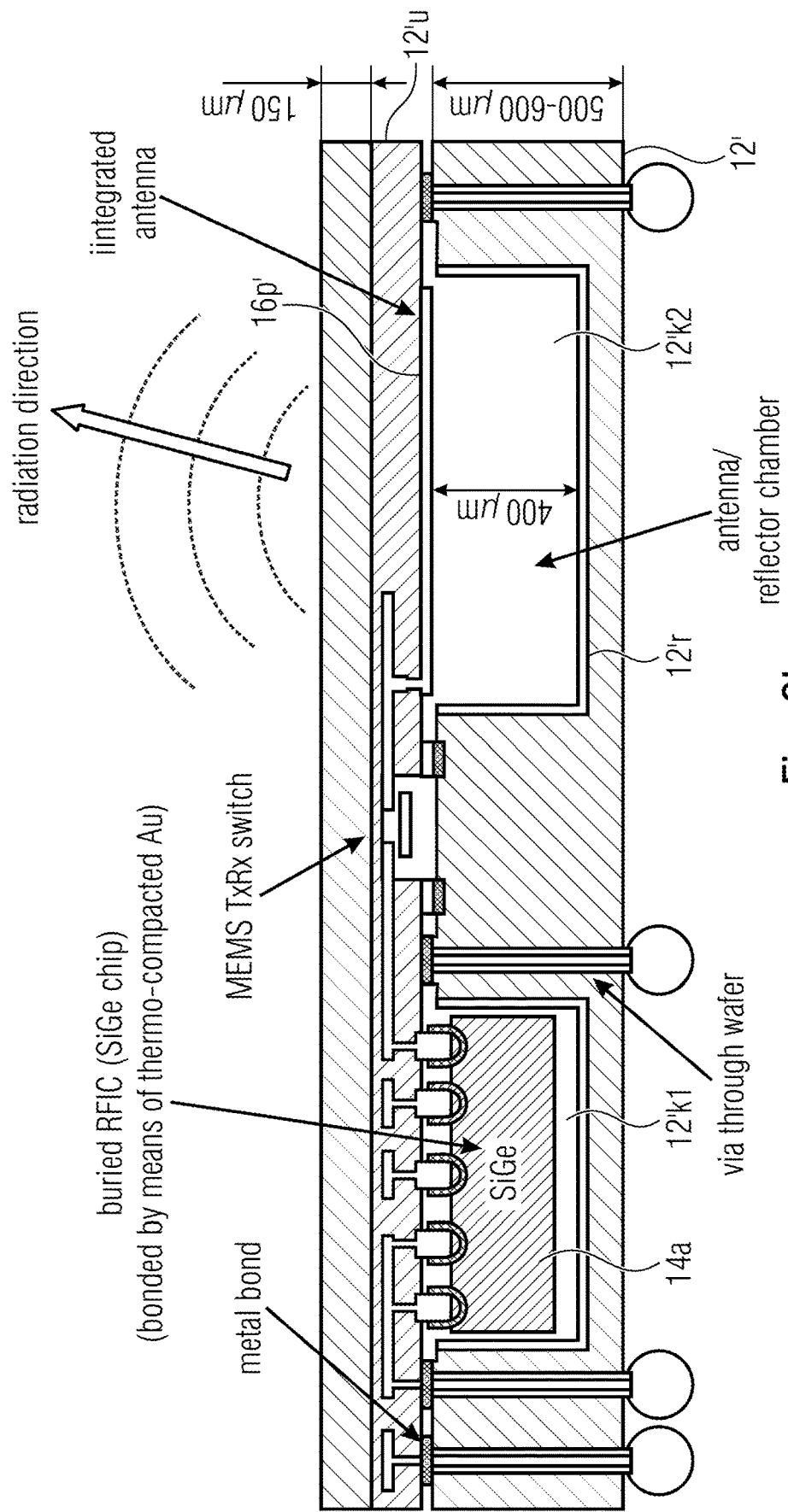
Figure 6C:
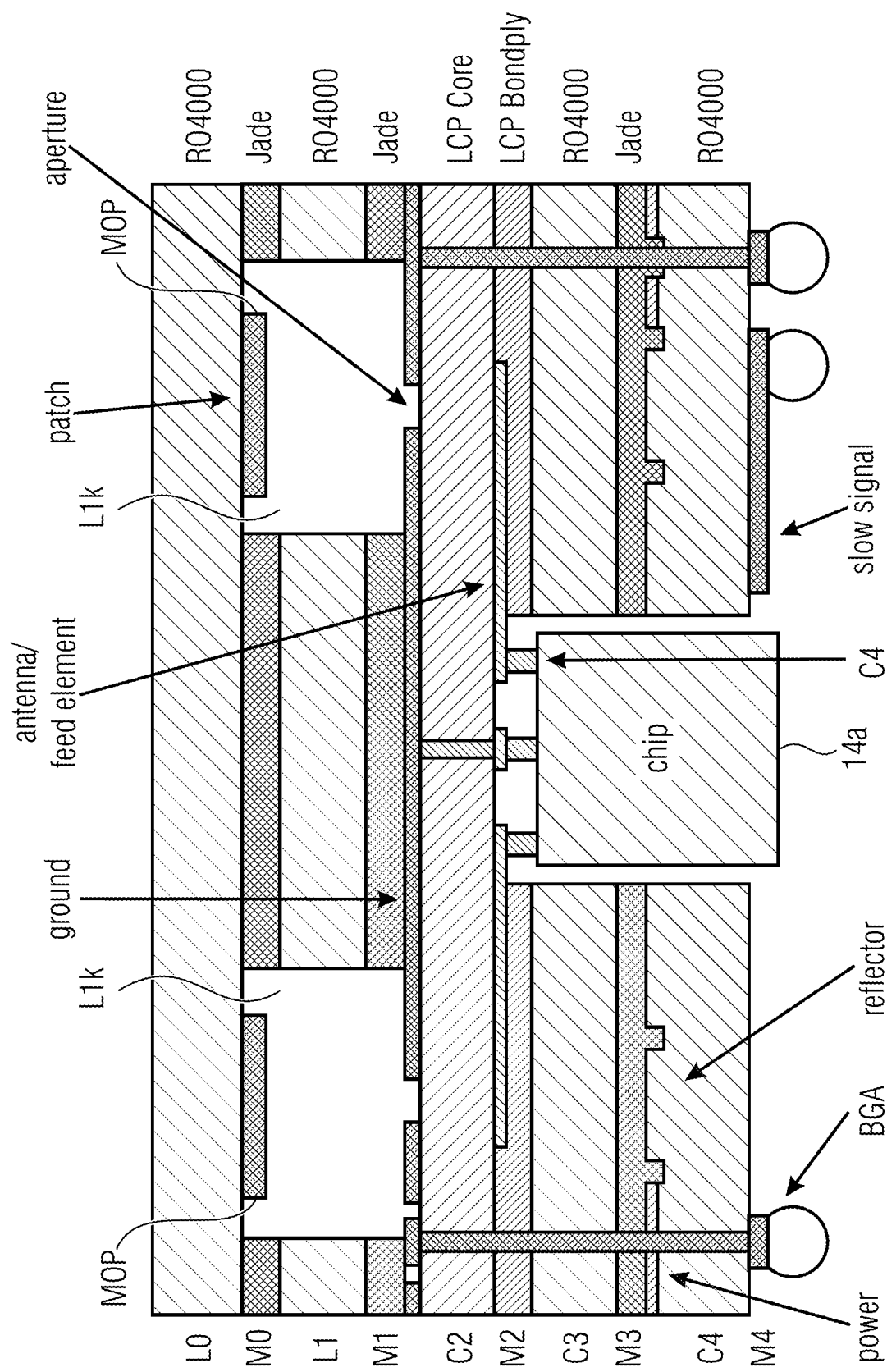

FIG. 5c shows a further module unit 20' that is comparable to the module unit 20' of FIG. 2a, however, instead of the connection means 22kkl', a type of cooling body, or a heat sink, 22kkl* is provided in the area of the chip 26'. For example, these elements 22kkl* are (thermo-conductively) connected to the chip 26' via the contacting plane 22k'.

The features explained with respect to FIGS. 5b and 5c may be identically carried over to the other embodiments (glass base or electromagnetic coupling).

Subsequently, essential elements of the embodiments are again explained in separate manner. According to a main embodiment, the module, or the module unit, at least includes a carrier substrate having a chip (IC or passive elements, or other electric components) embedded into the carrier substrate. In addition, a metal sheet is provided between the carrier substrate, or as part of the carrier substrate, for bonding with the next plane. The redistribution plane is arranged (RDL=Redistribution Layer) on the opposite side of the metal sheet. The antenna substrate may be provided on both sides of this redistribution layer. Optionally, the redistribution layer may include a shielding sheet. Alternatively, the shielding sheet may also be applied to the redistribution plane.

The antenna substrate applied to this shielding sheet, or redistribution sheet, at least includes an antenna element, a cavity filled with gas or air, and optional shielding elements such as a shielding via. In this case, vias for connecting the metal sheet and the redistribution plane may be provided (cf. reference numeral 22v' in FIG. 2a). The antenna substrate is provided above the shielding elements. Optionally, a thermal conduction structure, e.g. including so-called thermal balls or heat sinks, may be provided on the bottom side of the module (the side of the carrier substrate facing away from the antenna substrate).

According to a further embodiment, a manufacturing method including the simple step of applying the manufactured antenna substrate onto the carrier substrate is provided. Furthermore, the manufacturing method may include the following optional steps:

The manufacturing method, in particular the method for manufacturing the antenna substrate and/or the carrier substrate may include one or several of the following manufacturing technologies:

thin film wiring/multi-layer wiring (e.g. for manufacturing the redistribution plane);
mechanical thinning and polishing to reduce the substrate thickness (wafer)
dry etching with a stop on organic or inorganic layers to create the cavities in the antenna substrate;
dispensing or a vacuum filling process for filling trenches (e.g. embedding components in one of the substrates);
through-silicon or through-glass-wire technologies, e.g. for manufacturing through-contacts (vias);
chip placement using die bonding processes, e.g. for connecting the two substrates, i.e. the antenna substrate and carrier substrate;
temporary or permanent wafer bonding, e.g. for connecting the two substrates;
flip-chip bonding for component assembly;
wafer bumping and balling for manufacturing electrical connection structures;
flip-chip bonding for component assembly.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded. The data carrier, the digital storage medium, or the recorded medium are typically tangible, or non-volatile.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

The above-described devices may, for example, be implemented using a hardware apparatus, or using a computer, or using a combination of a hardware apparatus and a computer.

The above-described devices or any components of the above-described devices may at least be partially implemented in a hardware and/or software (computer program).

The above-described methods may, for example, be implemented using a hardware apparatus, or using a computer, or using a combination of a hardware apparatus and a computer.

The above-described methods or any components of the above-described methods may at least be partially implemented in a hardware and/or software (computer program).

The above-described embodiments merely represent an illustration of the principles of the present invention. It is understood that other persons skilled in the art will appreciate modifications and variations of the arrangements and details described herein. This is why it is in-tended that the invention be limited only by the scope of the following claims rather than by the specific details that have been presented herein by means of the description and the discussion of the embodiments.

The invention claimed is:

1. A module unit comprising:
a carrier substrate at least comprising an embedded chip and a redistribution layer arranged on a first main surface;
an antenna substrate comprising a base material, wherein the antenna substrate comprises an antenna structure arranged on a side of the first main surface, and a cavity introduced on a side of the second main surface, the cavity being aligned with the antenna structure at least in areas;
wherein the antenna substrate is connected with its second main surface to the first main surface of the carrier substrate so that the antenna substrate, together with the carrier substrate, forms a layer stack,
wherein the antenna substrate comprises a polymer layer or oxide layer arranged on the first main surface of the antenna substrate and carrying the antenna substrate;
wherein the cavity extends down to a depth, so that the cavity exposes the polymer layer or oxide layer from the side of the second main surface; or wherein the cavity extends down to a depth, so that the base material of the antenna substrate remains between the cavity and the polymer layer or oxide layer,
wherein the antenna substrate comprises a polymer sheet or oxide sheet arranged on the first main surface of the antenna substrate and carrying the antenna substrate.

2. The module unit according to claim 1, wherein at least one via protrudes through the antenna substrate and electrically connects the antenna structure to the redistribution layer.

3. The module unit according to claim 1, wherein the redistribution layer is electromagnetically coupled to the antenna structure.

4. The module unit according to claim 3, wherein the redistribution layer comprises a ground sheet that, in an area that is aligned with the antenna structure, comprises a recess, so that an electromagnetic signal for the electromagnetic coupling being coupled out through the recess; and/or
wherein the redistribution layer comprises a ground sheet configured to shield electromagnetic radiation emitted by the antenna structure.

5. The module unit according to claim 1, wherein at least one shielding via is provided next to the cavity in the antenna substrate and/or wherein a plurality of shielding vias surround the cavity in the antenna substrate.

6. The module unit according to claim 1, wherein the cavity and/or a wall of the cavity is metalized.

7. The module unit according to claim 1, wherein the polymer sheet or oxide sheet comprises a through-connection by which the antenna structure is electrically connected to the redistribution layer.

8. The module unit according to claim 1, wherein the base material of the antenna substrate comprises a semiconductor material.

9. The module unit according to claim 1, wherein the base material of the antenna substrate comprises a glass base.

10. The module unit according to claim 1, wherein the module units comprise a dielectric layer that is arranged on the antenna structure on the side of the first main surface of the antenna substrate.

11. The module unit according to claim 10, wherein the dielectric layer is at least partially perforated.

12. The module unit according to claim 10, wherein the base material of the antenna substrate is perforated in an area that is aligned with the antenna structure; and/or
wherein the base material of the antenna substrate is open in the area of the cavity.

13. The module unit according to claim 1, wherein the base material of the antenna substrate corresponds to a base material of the carrier substrate.

14. The module unit according to claim 1, wherein a reflector is arranged on the redistribution layer in an area aligned with the cavity and/or the antenna structure.

15. The module unit according to claim 1, wherein the carrier substrate comprises a contacting plane on the side of the second main surface.

16. The module unit according to claim 15, wherein the contacting plane comprises one or several solder balls, connectors and/or cooling elements.

17. A method for manufacturing a module unit comprising a carrier substrate which at least comprises an embedded chip and a redistribution layer arranged on the first main surface, and an antenna substrate which comprises an antenna structure arranged on the side of the first main surface, and a cavity introduced on the side of the second main surface, the cavity being aligned with the antenna structure at least in areas, the method comprising:
applying the antenna substrate with the side of the second main surface onto the redistribution layer of the carrier substrate, so that the antenna substrate and the carrier substrate form a layer stack,
wherein the antenna substrate comprises a polymer layer or oxide layer arranged on the first main surface of the antenna substrate and carrying the antenna substrate;
wherein the cavity extends down to a depth, so that the cavity exposes the polymer layer or oxide layer from the side of the second main surface; or wherein the cavity extends down to a depth, so that the base material of the antenna substrate remains between the cavity and the polymer layer or oxide layer.

* * * * *